(12) United States Patent
Wang et al.

(10) Patent No.: US 9,226,580 B2
(45) Date of Patent: Jan. 5, 2016

(54) ROTATION MECHANISM AND ELECTRONIC DEVICE

(71) Applicant: Wistron Corporation, New Taipei (TW)

(72) Inventors: Wei-Cheng Wang, New Taipei (TW); Hsueh-Fen Liao, New Taipei (TW); Chih-Chung Chen, New Taipei (TW); Yueh-Tsung Ho, New Taipei (TW); Keng-Hsien Yang, New Taipei (TW)

(73) Assignee: Wistron Corporation, New Taipei (TW)

( * ) Notice: Subject to any disclaimer, the term of this patent is extended or adjusted under 35 U.S.C. 154(b) by 9 days.

(21) Appl. No.: 14/321,820

(22) Filed: Jul. 2, 2014

(65) Prior Publication Data

US 2015/0282355 A1 Oct. 1, 2015

(30) Foreign Application Priority Data

Apr. 1, 2014 (TW) .............................. 103112158 A (51) Int. Cl.
*A47B 91/00* (2006.01)
*H05K 5/02* (2006.01)
*F16H 21/12* (2006.01)
*F16M 11/24* (2006.01)

(52) U.S. Cl.
CPC .............. *A47B 91/005* (2013.01); *F16H 21/12* (2013.01); *F16M 11/242* (2013.01); *H05K 5/0234* (2013.01); *F16M 2200/068* (2013.01); *F16M 2200/08* (2013.01); *Y10T 74/1836* (2015.01)

(58) Field of Classification Search
CPC .... H05K 5/0234; A47B 91/005; F16H 21/12; F16M 11/242; F16M 11/42; F16M 11/38; F16M 2200/068; F16M 2200/08

USPC .......... 248/349.1, 918, 346.01, 346.07, 188.1
See application file for complete search history.

(56) References Cited

U.S. PATENT DOCUMENTS

| | | | | | |
|---|---|---|---|---|---|
| 3,923,318 | A | * | 12/1975 | Renard | A45C 13/385 280/35 |
| 4,449,969 | A | * | 5/1984 | Schweizer | A61M 1/0019 248/528 |
| 4,712,758 | A | * | 12/1987 | Cuschera | A47B 13/023 248/188.7 |
| 4,919,383 | A | * | 4/1990 | Benjamin | A47F 5/02 248/349.1 |
| 4,955,873 | A | * | 9/1990 | Rajlevsky | A61M 1/0001 128/DIG. 24 |
| 6,234,434 | B1 | * | 5/2001 | Avinger | A47G 33/12 248/188.7 |
| 6,419,198 | B1 | * | 7/2002 | Einav | A47B 91/005 248/346.03 |

* cited by examiner

*Primary Examiner* — Anita M King
(74) *Attorney, Agent, or Firm* — Jianq Chyun IP Office (57) ABSTRACT

A rotation mechanism includes a first rotary member defining an axis, a second rotary member, a track disc, a first rod and a second rod. The first rotary member, the second rotary member and the track disc are assembled coaxially, and the first rotary member and the second rotary member rotate relative to the track disc. The track disc has a first groove, a second groove, a third groove and a center passed by the axis. The first and the second grooves are sited at the same circumference, and an extension direction of the third groove passes through the center. The first rod has a first end slidably disposed in the first groove, and a second end. The second rod has a third end pivoted to the second end and slidably disposed in the third groove, and a fourth end slidably disposed in the second groove.

13 Claims, 7 Drawing Sheets

ROTATION MECHANISM AND ELECTRONIC DEVICE

CROSS-REFERENCE TO RELATED APPLICATION

This application claims the priority benefit of Taiwan application serial no. 103112158, filed on Apr. 1, 2014. The entirety of the above-mentioned patent application is hereby incorporated by reference herein and made a part of this specification.

BACKGROUND

1. Field of the Invention

The present invention relates to a rotation mechanism and an electronic device. More particularly, the present invention relates to rotation mechanism capable of being conveniently opened and closed and an electronic device having the same.

2. Description of Related Art

With the advent of the information age, the computer products get more popular year by year. In general, for desktop computers, people put more emphasis on the performance and the desktop computer is not often moved, so that a desktop computer usually appears bulky and heavy and occupies much work space on a desk. In addition, a desktop computer needs to be connected to a display device via a cable, which makes the placing position thereof limited by the cable length. With advances in technology and the integration idea, electronic products are developed towards slim design, and such slenderized developing tendency of the electronic products leads to growing popularity of the computer devices that more slenderized than the desktop computers, such as all-in-one PC (AIO PC) or mini computers, in the market of electronic products.

In terms of mini computers, part of the mini computers have a plurality of stands on the bottom thereof which can be relatively opened and closed so as to provide better support. When not in use, the stands can be closed to save space. However, in operation, the stands have to be moved to particular positions one by one, which is more troublesome. Accordingly, if a mechanism that allows the stands to be opened and closed synchronously once can be designed, it will contribute to better usage experience for a user.

According to related technical documents and products that are published so far, a mechanism capable of rotating two coaxially rotating objects reversely, such as a rotation mechanism like a dual-propeller helicopter, is provided. The rotation mechanism utilizes a complicated and space-occupying gear assembly to achieve the coaxial but reverse rotation of the upper and the lower propellers. Another provided mechanism is a planetary gear combination which includes a sun gear located in the center, an outer ring gear surrounding the sun gear and two planetary gears, for example, engaged in the gap between the sun gear and the outer ring gear. With the transmission of the planetary gears, the sun gear and the outer ring gear produce coaxial but reverse rotation behaviors. Although the former can achieve the rotation of the two propellers at the same speed for the same angle, the gear assembly is excessively complicated and space-occupying. As for the later, the sun gear and the outer ring gear cannot synchronously rotate for the same angle, even cannot rotate in the same rotation speed, and much worse, at least four gears with different sizes are required, which have a great number of parts and are space-occupying. In light of the foregoing, the two known types of rotation mechanisms still cannot effectively satisfy the demands of the issues above.

SUMMARY

The invention provides a rotation mechanism having two rotary members which are capable of synchronously rotating.

The invention provides an electronic device having the rotation mechanism by which two stands are capable of synchronously rotating.

The invention provides a rotation mechanism including a first rotary member, a second rotary member, a track disc, a first rod and a second rod. The first rotary member defines an axis. The second rotary member is assembled to the first rotary member coaxially and rotatable relative to the first rotary member. The track disc is assembled coaxially with the first rotary member and the second rotary member and located between the first rotary member and the second rotary member, such that and the first rotary member and the second rotary member are rotatable relative to the track disc. The track disc has a first groove, a second groove and a third groove. The track disc defines a center passed by the axis. The first and the second grooves are sited at the same circumference, and an extension direction of the third groove passes through the center. The first rod has a first end and a second end which are opposite to each other. The first end is slidably disposed in the first groove. The second rod has a third end and a fourth end which are opposite to each other. The fourth end is slidably disposed in the second groove. The third end is pivoted to the second end of the first rod and slidably disposed in the third groove. When one of the first rotary member and the second rotary member rotates, the other one of the first rotary member and the second rotary member is driven by the linkage of the first rod and the second rod to rotate synchronously and reversely.

The invention further provides an electronic device includes a body, the rotation mechanism, a first stand and a second stand. The track disc is fixed to the body. The first stand is fixed to the first rotary member. The second stand is fixed to the second rotary member. When the first stand rotates relative to the body, the second stand is driven by the linkage of the rotation mechanism to rotate relative to the first stand synchronously and reversely.

To sum up, in the rotation mechanism of the invention, the first and the second grooves are sited at the same circumference and the third groove having the extension direction passing through the center are on the track disc. Further, the first end of the first rod is slidably disposed in the first groove, the fourth end of the second rod is slidably disposed in the second groove, and the third end of the second rod is pivoted to the second end of the first rod and slidably disposed in the third groove together. With such design, when one of the first rotary member and the second rotary member rotates, the other one of the first rotary member and the second rotary member is driven by the linkage of the first rod and the second rod to rotate synchronously and reversely. Moreover, the first stand and the second stand of the electron device are respectively fixed to the first rotary member and the second rotary member. Thus, when a user turns one of the first stand and the second stand, the other one of the first stand and the second stand rotates therewith synchronously and reversely, such that the first stand and the second stand can be conveniently opened or closed.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the embodiment, and are incorporated in and constitute a part of this specification. The drawings illustrate embodiments and, together with the description, serve to explain the principles of the embodiment.

DESCRIPTION OF EMBODIMENTS

Figure 1A:
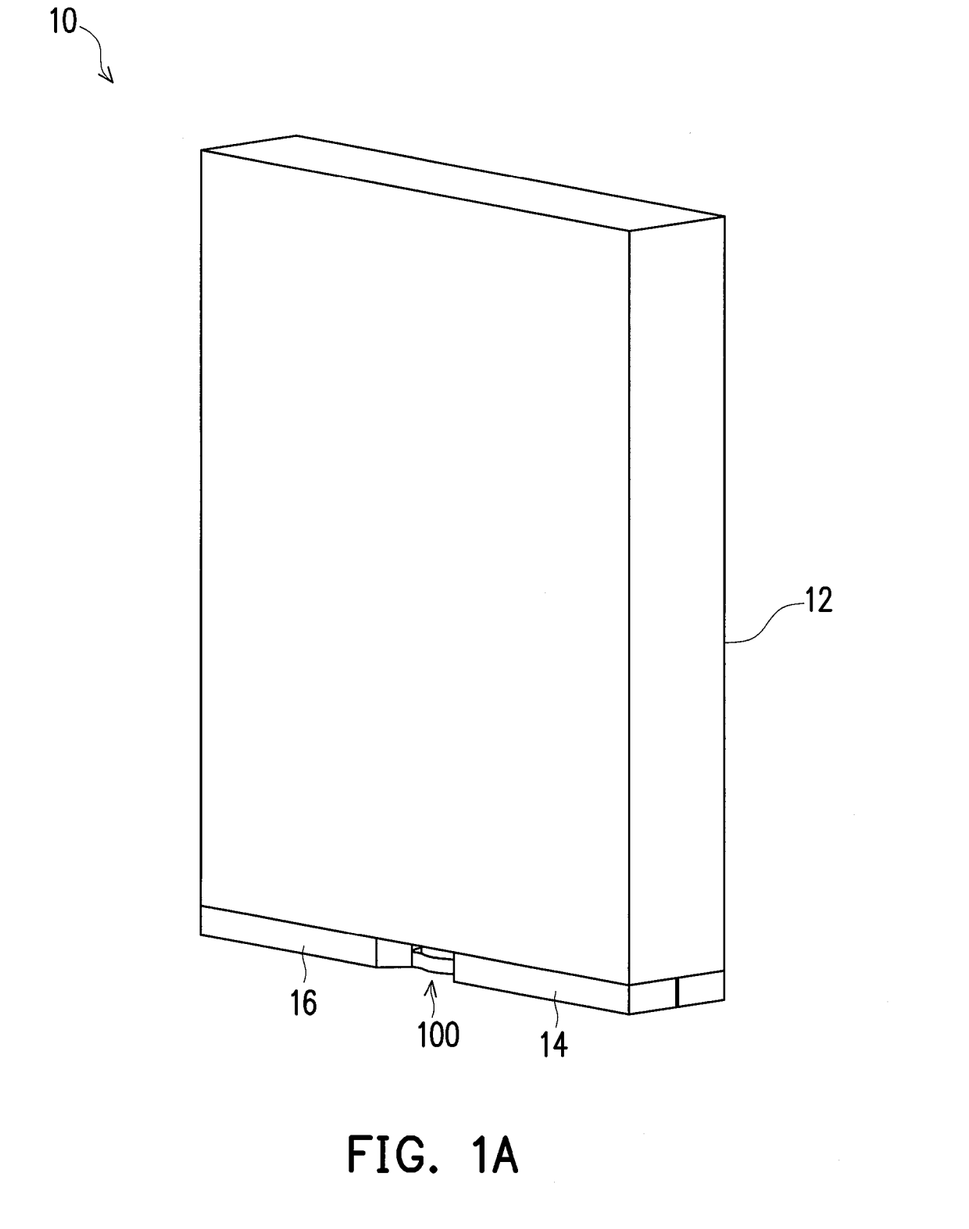
FIG. 1A is a schematic three-dimensional diagram illustrating an electronic device according to an embodiment of the invention.
Figure 1B:
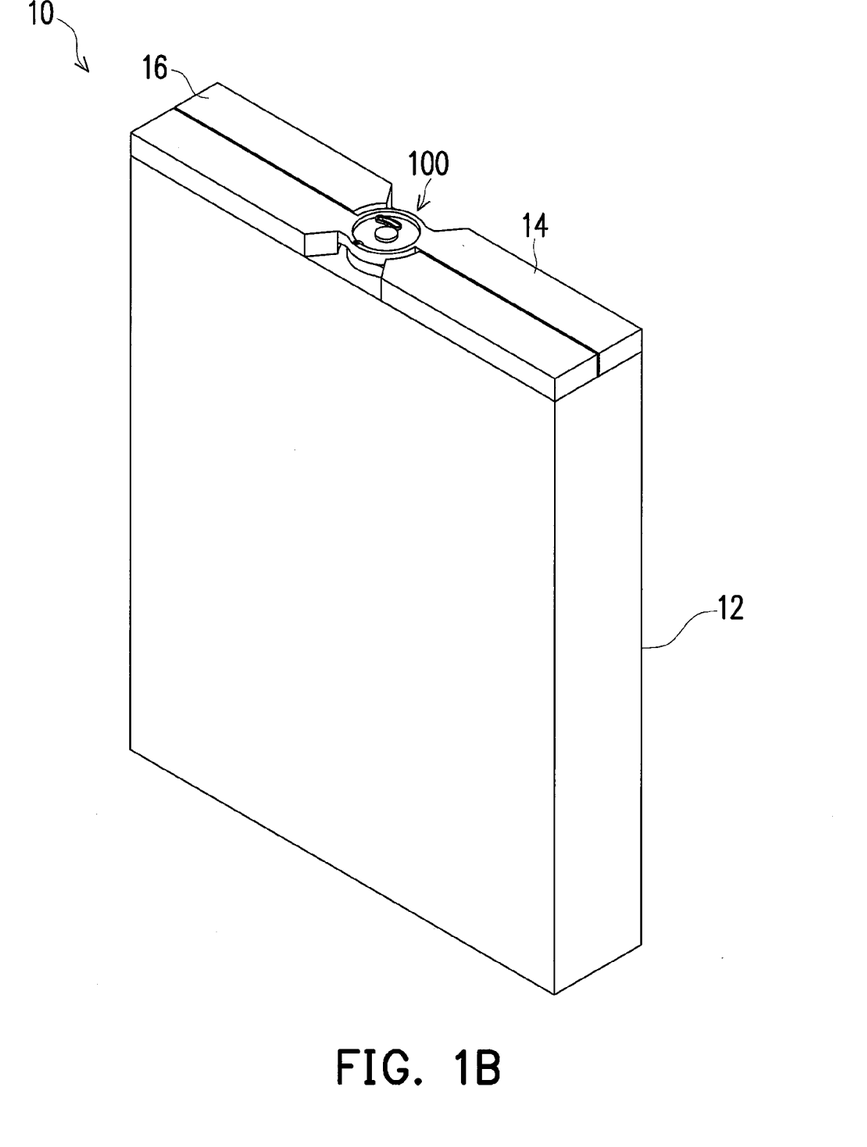
FIG. 1B is a schematic diagram of FIG. 1A in another angle.
Figure 2A:
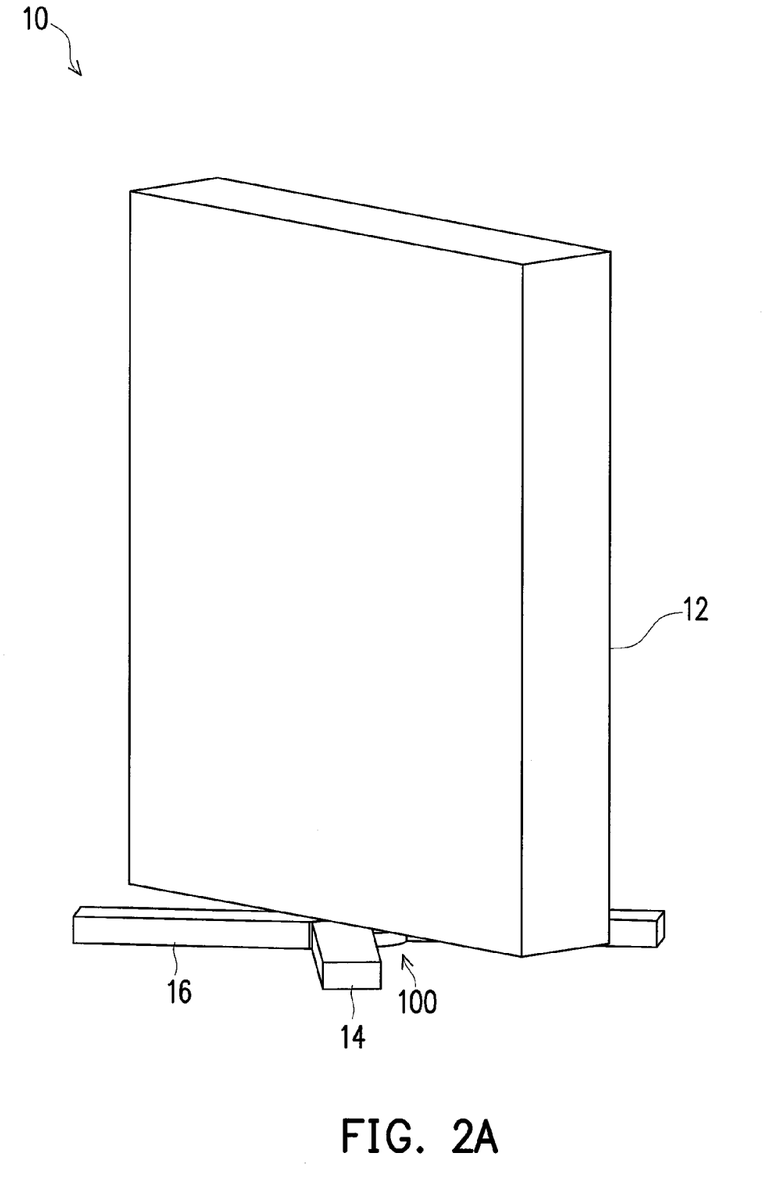
FIG. 2A is a schematic three-dimensional diagram illustrating a first stand and a second stand of the electronic device of FIG. 1A being opened.
Figure 2B:
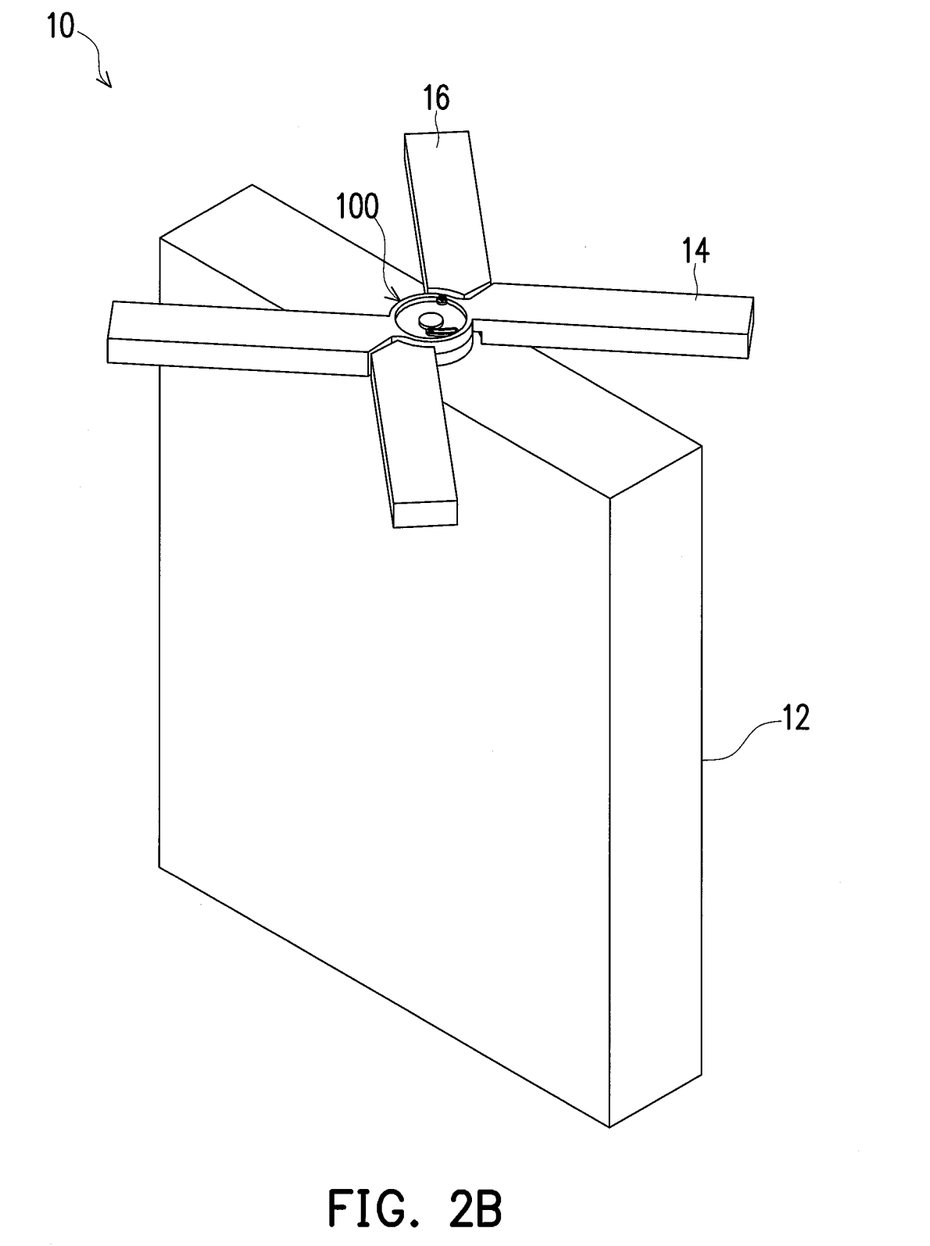
FIG. 2B is a schematic diagram of FIG. 2A in another angle.

FIG. 1A is a schematic three-dimensional diagram illustrating an electronic device according to an embodiment of the invention. FIG. 1B is a schematic diagram of FIG. 1A in another angle. FIG. 2A is a schematic three-dimensional view illustrating a first stand and a second stand of the electronic device of FIG. 1A being opened. FIG. 2B is a schematic diagram of FIG. 2A in another angle. It should be mentioned that the viewing angle of FIG. 1B and FIG. 2B are the angle viewing FIG. 1A and FIG. 2A from bottom to top.

With reference to FIG. 1A through FIG. 2B, an electronic device 10 of the present embodiment includes a body 12, a rotation mechanism 100, a first stand 14 and a second stand 16. In this embodiment, the electronic device 10 is a mini computer. The body 12 is a casing of the mini computer. However, the electronic device 10 may also be a general type desktop computer host or any other device. The invention is not intended to limit the type of the electronic device 10.

The first stand 14 and the second stand 16 may form a Z shape or a line shape relative to the rotation mechanism 100. Accordingly, the first stand 14 and the second stand 16 may be arranged side by side to form a line shape when being closed relative to the body 12, as shown in FIG. 1A and FIG. 1B, or may rotate and be opened relative to the body 12 to form a X shape, as shown in FIG. 2A and FIG. 2B, so as to provide the body 12 with better support. It is to be mentioned that in order to open or close the first stand 14 and the second stand 16 more conveniently, in the present embodiment, the first stand 14 and the second stand 16 are disposed beneath the body 12 through the rotation mechanism. Thereby, the first stand 14 and the second stand 16 may rotate synchronously and reversely. That is, as long as a user turns one of the first stand 14 and the second stand 16, the other of the first stand 14 and the second stand 16 also rotates reversely for the same angle and in the same speed. By doing so, the user does not have to turns out or in the first stand 14 and the second stand 16 one by one, which the operation is more conveniently and quickly for operation. A type of the rotation mechanism 100 will be described in detail below.

Figure 3:
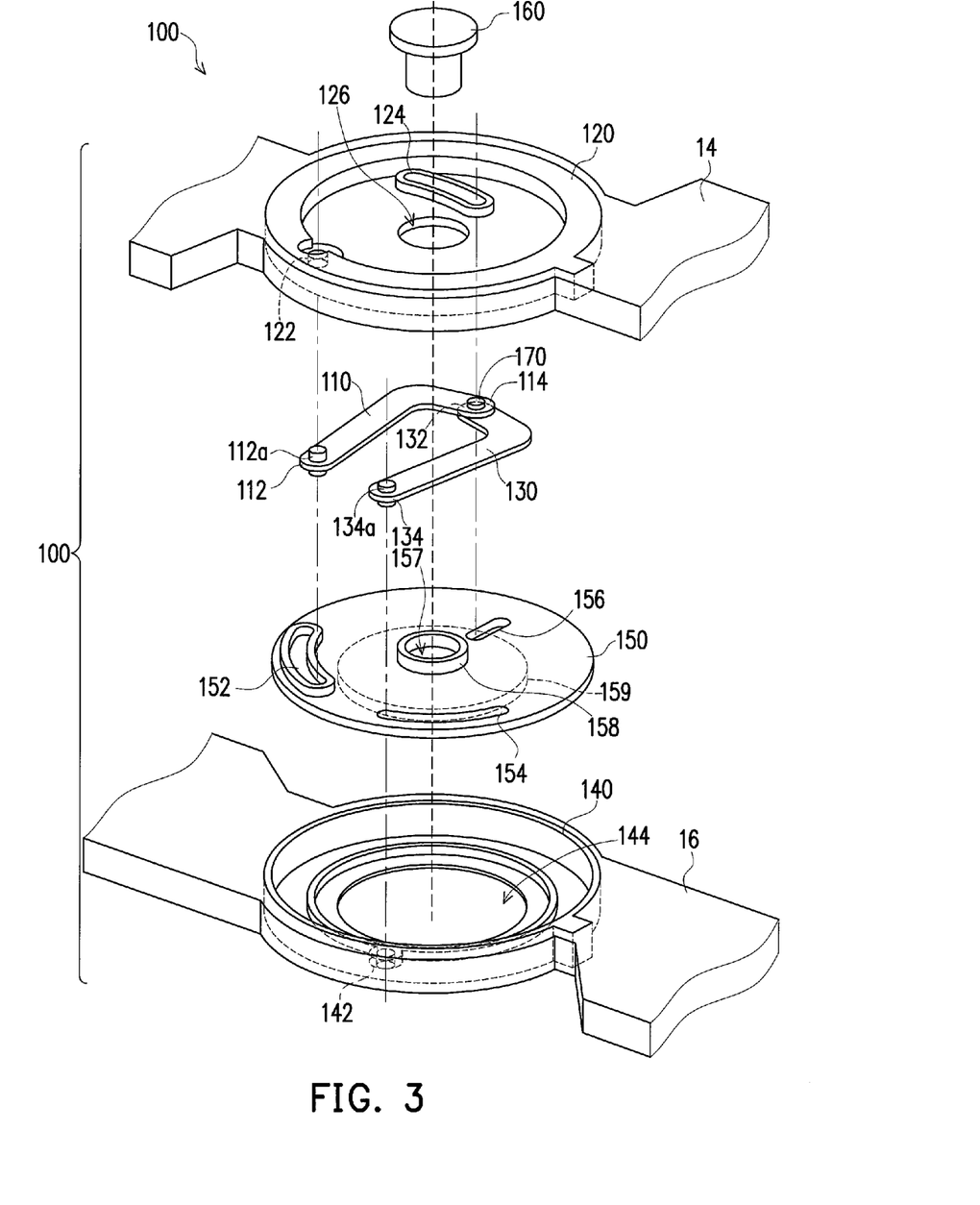
FIG. 3 is an exploded diagram of a rotation mechanism according to an embodiment of the invention.

FIG. 3 is an exploded diagram of a rotation mechanism according to an embodiment of the invention. With reference to FIG. 3, a rotation mechanism 100 of the present embodiment includes a first rod 110, a first rotary member 120, a second stand 140 and a track disc 150.

The first rod 110 has a first end 112 and a second end 114 which are opposite to each other. The first rotary member 120 is pivoted to the first end 112 of the first rod 110. The first rotary member 120 is disc-shaped and has a first axle hole 126. The first rotary member 120 has a first fixing portion 122 adjacent to the edge. In the present embodiment, the first fixing portion 122 is a hole. The first end 112 of the first rod 110 is pivoted to the first rotary member 120 by one end of the first guide rod 112a passing through the first fixing portion 122. The first rotary member 120 may be a part of the first stand 14, which may be integrated with the first stand 14 or fixed and assembled to the first stand 14.

The second rod 130 has a third end 132 and a fourth end 134 which are opposite to each other. The third end 132 of the second rod 130 is pivoted to the second end 114 of the first rod 110 by a common guide rod 170. The second rotary member 140 has a second fixing portion 142 adjacent to the edge. In the present embodiment, the second fixing portion 142 is a hole. The fourth end 134 of the second rod 130 is pivoted to the second rotary member 120 by one end of the second guide rod 134a passing through the second fixing portion 142. The second rotary member 140 has a second axle hole 144. In the present embodiment, the second rotary member 140 is assembled to the first rotary member 120, such that the first rotary member 120 and the second rotary member 140 may rotate relative to each other coaxially around the same axis A. Likewise, the second rotary member 140 may be a part of the second stand 16, which may be integrated with the second stand 16 or fixed and assembled to the second stand 16.

The track disc 150 is assembled between the first rotary member 120 and the second rotary member 140. In the present embodiment, the first rotary member, the second rotary member and the track disc are disc-shaped respectively, and centers of the first rotary member 120, the second rotary member 140 and the track disc 150 are coaxial. The track disc 150 has a central axle hole 157, a side of the central axle hole 157 has a first ring flange 158, and the other side of the central axle hole 157 has a second ring flange 159. An outer diameter of the first ring flange 158 is not greater than an inner diameter of the first axle hole 126 and thus, may be sheathed into the first axle hole 126. The rotation mechanism 100 further includes a fixing axle bolt 160 used to penetrate through the first axle hole 126 and the central axle hole 157 to freely move the first rotary member 120 relative to the track disc 150. The second ring flange 159 is used to be sheathed into the second axle hole 144 of the second rotary member 140, such that the second rotary member 140 may freely rotate relative to the track disc 150. Thereby, the first rotary member 120, the second rotary member 140 and the track disc 150 may be stacked and assembled together, such that the first rotary member 120 and the second rotary member 140 may rotate relative to each other. Nevertheless, in the rotation mechanism 100 of the invention, the structure of and the way to sheath the first rotary member 120, the second rotary member 140 and the track disc 150 are not limited to the description of the present embodiment set forth herein. Structures that can enable the first rotary member 120 and the second rotary member 140 to respectively rotate relative to the track disc 150 can achieve the same purpose and effects of the invention and thus, fall within the scope pertain to the invention.

In the present embodiment, the first rod 110 and the second rod 130 are held and may freely move in a space between the first rotary member 120 and the track disc 150. The first rod 110 and the second rod 130 are L shaped to avoid the first ring flange 158 of the track disc 150. Certainly, in other embodiments, relative positions and shapes of the first rod 110 and the second rod 130 are not limited in the invention, and the first rod 110 and the second rod 130 may be straight bar-shaped or arc-shaped. In other embodiments, the first ring flange 158 in the center of the track disc 150 and the fixing axle bolt 160 may be canceled, but other structures may be used to separate the first rotary member 120 and the track disc 150 and allow the first rotary member 120 to rotate relative to the track disc 150 (for example, peripheral ring structures may be used to shaft together instead of using the central rotation axle). In such circumstance, the first rod 110 and the second rod 130 are less limited in the shapes and may have more varieties.

The track disc 150 includes a first groove 152, a second groove 154 and a third groove 156. The first groove 152 and the second groove are respectively arc-shaped, and curvature centers of both the first groove 152 and the second groove 154 are located at the center of the track disc 150. Namely, the first groove 152 and the second groove 154 are sited in different positions on the same circumference with the same radius. Additionally, in the present embodiment, a central angle formed by two ends of the first groove 152 and the center is identical to a central angle formed by two ends of the second groove 154 and the center, and each center angle ranges from 40 to 45 degrees, which depends on the design requirement for opening the first stand and the second stand 16. Nevertheless, the angle range is merely an example of the present embodiment and construes no limitations to the angle range adopted by the invention.

In the present embodiment, the first groove 152 and the second groove 154 are sited at the same circumference on the track disc 150. Namely, on the track disc 150, a circle passing through the first groove 152 coincides with a circle passing through the second groove 154. Certainly, in other embodiments, the first groove 152 and the second groove 154 may be sited at different circumferences on the track disc 150. Additionally, the third groove 156 is long strip-shaped and distributed along a radial direction of the track disc 150. In other words, the center of the track disc 150 is sited on an extension line of the third groove 156.

In the present embodiment, The first end 112 of the first rod 110 is slidably disposed in the first groove 152 through the other end of the first guide rod 112a, the fourth end 134 of the second rod 130 is slidably disposed in the second groove 154 through the other end of the second guide rod 134a, and the second end 114 of the first rod 110 and the third end 132 of the second rod 130 are slidably disposed in the third groove 156 through one end of the common guide rod 170. In other words, the first rotary member 120 and the second rotary member 140 may be linked to each other through the first rod 110 and the second rod 130 to rotate relative to the track disc 150 synchronously. Additionally, in the present embodiment, the first rotary member 120 further includes a fourth groove 124. The other end of the common guide rod 170 is slidably disposed in the fourth groove 124, so as to further limit a relative movement path between the first rotary member 120 and the first rod 110.

With reference to FIG. 3, in the present embodiment, the assembling of the first rotary member 120, the track disc 150 and the second rotary member 140 depends not only on the assembling of the first end 112 and the second end 114 of the first rod 110 and the third end 132 and the fourth end 134 of the second rod 130, but also on respectively sheathing the first ring flange 158 and the second ring flange 159 on two opposite surfaces of the track disc 150 to the first axle hole 126 of the first rotary member 120 and the second axle hole 144 of the second rotary member 140. Moreover, the first rotary member 120 and the second rotary member 140 also have corresponding locking structures adjacent to the edges. Thereby, the first rotary member 120 and the second rotary member 140 may rotate relative to each other without moving relative to each other along the axial direction.

Figure 4A:
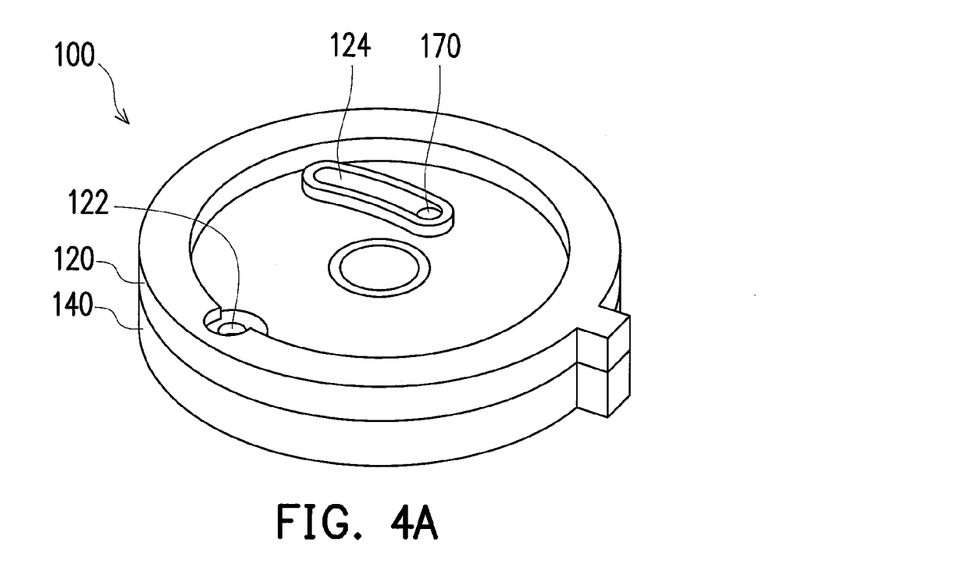
FIG. 4A and FIG. 4B are schematic diagrams illustrating the appearance of the rotation mechanism of FIG. 3 before and after the rotation.
Figure 4B:
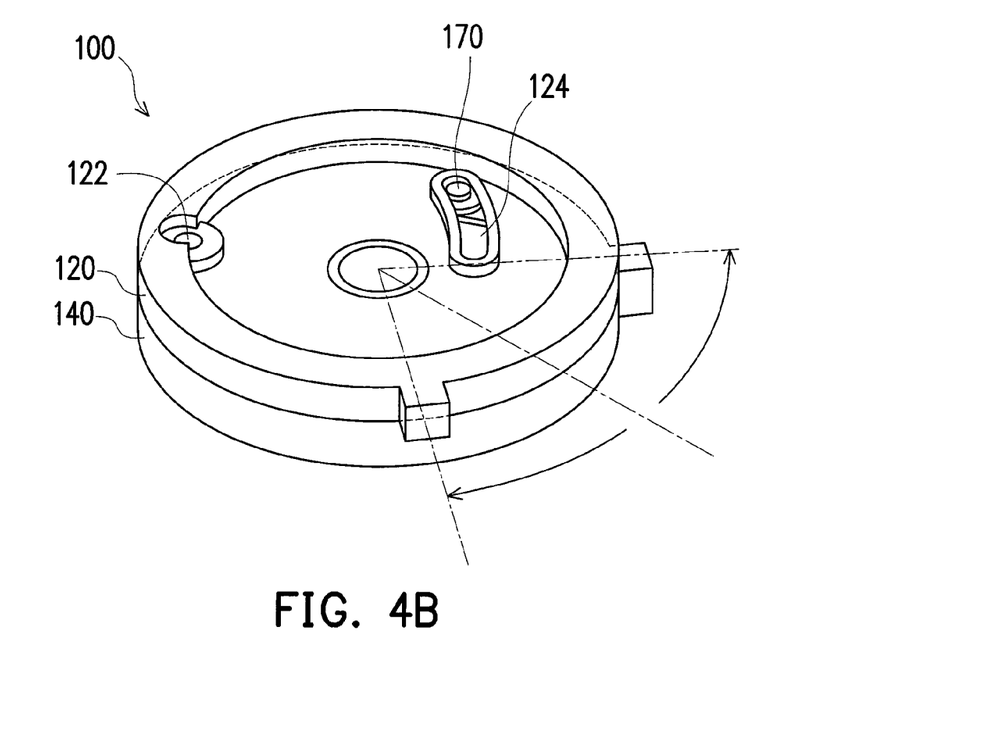
Figure 5A:
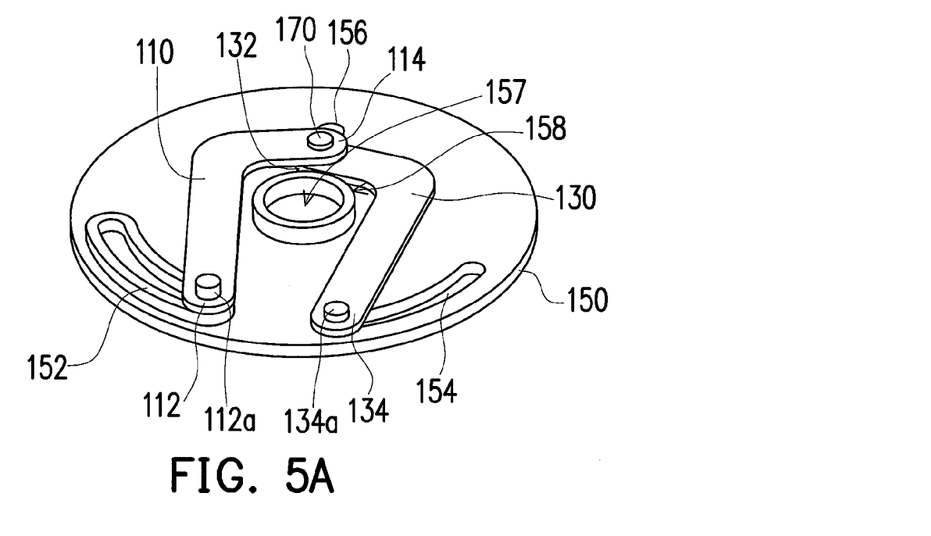
FIG. 5A and FIG. 5B are schematic diagrams where the first rotary member and the second rotary member of FIG. 4A and FIG. 4B are hidden.
Figure 5B:
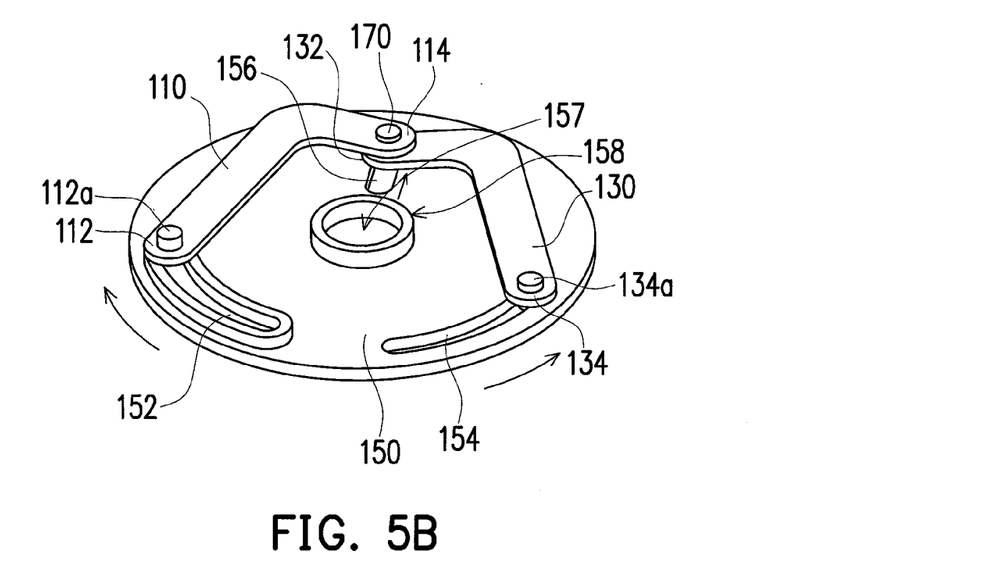

FIG. 4A and FIG. 4B are schematic diagrams illustrating the appearance of the rotation mechanism of FIG. 3 before and after the rotation. FIG. 5A and FIG. 5B are schematic diagrams where the first rotary member and the second rotary member are hidden. In FIG. 5A and FIG. 5B, the first rotary member 120 and the second rotary member 140 are deliberately hidden to clearly show the relative positional relationship among the first rod 110, the second rod 130 and the track disc 150 before and after the rotation.

With reference to FIG. 4A and FIG. 5A, before the first rotary member 120 or the second rotary member 140 rotates, the first end 112 of the first rod 110 and the fourth end 134 of the second rod 130 are respectively located in positions in the first groove 152 and the second groove 154 that are closer to each other, while the common guide rod 170 is located in a position in the third groove 156 that is closer to the central axle hole 157 and at the right end of the fourth groove 124.

With reference to FIG. 4B and FIG. 5B, when the user clockwise turns the first rotary member 120, The first end 112 of the first rod 110 is driven by the first rotary member 120 to move toward the upper left in the first groove 152, as shown in FIG. 4B and FIG. 5B, and together therewith, the second end 114 of the first rod 110 moves upward in the third groove 156. Due to the second end 114 of the first rod 110 pivoted to the third end 132 of the second rod 130 by the common guide rod 170, the third end 132 of the second rod 130 is driven by the second end 114 of the first rod 110 to moves upward, and the fourth end 134 of the second rod 130 is driven by the third end 132 to move toward the upper right in the second groove 154. In this way, the second rotary member 140 pivoted to the fourth end 134 of the second rod 130 synchronously rotates counterclockwise, and thus, the common guide rod 170 is located at the left end of the fourth groove 124. Likewise, when the user turns the second rotary member 140, the second rod 130 and the first rod 110 are driven, such that the first rotary member 120 rotates synchronously.

Accordingly, in the rotation mechanism 100 of the present embodiment, with the configuration of the first rotary member 120, the first rod 110, the second rod 130, the second rotary member 140 and the track disc 150, the first rotary member 120 and the second rotary member 140 may be linked with each other to rotate synchronously and reversely at the same speed.

Returning to FIG. 1A through FIG. 2B again, in the electronic device 10 of the present embodiment, the track disc 150 of the rotation mechanism 100 depicted in FIG. 3 is fixed to the body 12. The first stand 14 is fixed to the first rotary member 120. The second stand 16 is fixed to the second rotary member 140 and located on the same plane with the first stand 14. When the first stand 14 rotates relative to the body 12, the second stand 16 is driven to rotate synchronously, so as to achieve an effect of being conveniently opened and closed.

It is to be mentioned that in comparison with an ordinary rotation mechanism using a gear assembly, besides advantages of low cost and simple structure, the rotation mechanism 100 of the present embodiment also has a small volume and moreover, has no issues of speed difference occurring between the first rotary member 120 and the second rotary member 140 due to different sizes and numbers of gears disposed in an inner and an outer raceways.

Based on the above, in the rotation mechanism of the invention, the first and the second grooves sited at the same circumference and the third groove having the extension direction passing through the center are on the track disc. Further, the first end of the first rod is slidably disposed in the first groove, the fourth end of the second rod is slidably disposed in the second groove, and the third end of the second rod is pivoted to the second end of the first rod and slidably disposed in the third groove. With such design, when one of the first rotary member and the second rotary member rotates, the other one of the first rotary member and the second rotary member can be driven by the linkage of the first rod and the second rod to rotate synchronously and reversely. Moreover, the first stand and the second stand of the electron device of the invention are respectively fixed to the first rotary member and the second rotary member. Thus, when the user turns one of the first stand and the second stand, the other also rotates synchronously and reversely, such that the first stand and the second stand can be conveniently opened or closed.

Although the invention has been described with reference to the above embodiments, they are not intended to limit the invention. It is apparent to people of ordinary skill in the art that modifications and variations to the invention may be made without departing from the spirit and scope of the invention. In view of the foregoing, the protection scope of the invention will be defined by the appended claims.

What is claimed is:

1. A rotation mechanism, comprising:
a first rotary member, defining an axis;
a second rotary member, assembled to the first rotary member coaxially and rotatable relative to the first rotary member;
a track disc, assembled coaxially with the first rotary member and the second rotary member and located between the first rotary member and the second rotary member, such that the first rotary member and the second rotary member are rotatable relative to the track disc, wherein the track disc has a first groove, a second groove and a third groove and a center passed by the axis, the first and the second grooves are sited at the same circumference, and an extension direction of the third groove passes through the center;
a first rod, having a first end and a second end which are opposite to each other, wherein the first end is slidably disposed in the first groove; and
a second rod, having a third end and a fourth end which are opposite to each other, wherein the fourth end is slidably disposed in the second groove, and the third end is pivoted to the second end of the first rod and slidably disposed in the third groove, when one of the first rotary member and the second rotary member rotates, the other one of the first rotary member and the second rotary member is driven by the linkage of the first rod and the second rod to rotate synchronously and reversely.

2. The rotation mechanism according to claim 1, wherein the first rod and the second rod are held and freely movable between the first rotary member and the track disc.

3. The rotation mechanism according to claim 1, wherein the first end of the first rod has a first guide rod, the first rotary member has a first fixing portion, one end of the first guide rod is pivoted to the first fixing portion while the other end of the first guide rod is slidably disposed in the first groove, the fourth end of the second rod has a second guide rod, the second rotary member has a second fixing portion, and one end of the second guide rod is pivoted to the second fixing portion while the other end of the second guide rod is slidably disposed in the second groove.

4. The rotation mechanism according to claim 3, wherein the first rotary member further comprises a fourth groove, the second end of the first rod and the third end of the second rod are connected with a common guide rod together, one end of the common guide rod is slidably disposed in the third groove, and the other end of the common guide rod is slidably disposed in the fourth groove.

5. The rotation mechanism according to claim 1, wherein the first rotary member has a first axle hole, the second rotary member has a second axle hole, the track disc has a central axle hole, and the first axle hole, the second axle hole and the central axle hole are coaxial to the axis.

6. The rotation mechanism according to claim 5, wherein one side of the central axle hole of the track disc which faces the first rotary member has a first ring flange for being pivotally assembled to the first axle hole, and the other side of the central axle hole of the track disc which faces the second rotary member has a second ring flange for being pivotally assembled to the second axle hole.

7. The rotation mechanism according to claim 6, further comprising a fixing axle bolt for penetrating through the first axle hole and the central axle hole.

8. The rotation mechanism according to claim 1, wherein the first rod and the second rod respectively present in a L shape to avoid the axis.

9. The rotation mechanism according to claim 1, wherein the first rod and the second rod respectively present in a straight bar shape or an arc shape.

10. The rotation mechanism according to claim 1, wherein both the first and the second grooves present in an arc shape, and a central angle formed by two ends of each of the first and the second grooves and the center ranges from 40 to 45 degrees.

11. An electronic device, comprising:
a body;
a rotation mechanism according to claim 1, wherein the track disc is fixed to the body;
a first stand, fixed to the first rotary member; and
a second stand, fixed to the second rotary member, wherein when the first stand rotates relative to the body, the second stand is driven by the linkage of the rotation mechanism to rotate relative to the first stand synchronously and reversely.

12. The electronic device according to claim 11, wherein the first stand and the second stand rotate on the same rotation plane.

13. The electronic device according to claim 12, wherein the first stand and the second stand form a line shape when being closed relative to the body and form an X shape when being opened relative to the body.

* * * * *